(12) United States Patent
Mooradian

(10) Patent No.: US 6,898,225 B2
(45) Date of Patent: May 24, 2005

(54) COUPLED CAVITY HIGH POWER SEMICONDUCTOR LASER

(75) Inventor: Aram Mooradian, Sunnyvale, CA (US)

(73) Assignee: Novalux, Inc., Sunnyvale, CA (US)

( * ) Notice: Subject to any disclaimer, the term of this patent is extended or adjusted under 35 U.S.C. 154(b) by 0 days.

(21) Appl. No.: 10/899,779

(22) Filed: Jul. 26, 2004

(65) Prior Publication Data

US 2005/0002433 A1 Jan. 6, 2005

Related U.S. Application Data

(62) Division of application No. 09/519,890, filed on Mar. 6, 2000, now Pat. No. 6,778,582.

(51) Int. Cl.[7] ............................ H01S 5/00; H01S 3/082; H01S 3/08; H01L 21/00
(52) U.S. Cl. ............................ 372/43; 372/50; 372/97; 372/99; 372/108; 438/29; 438/72
(58) Field of Search ................................ 372/43, 50, 96, 372/97, 98, 99, 108; 438/29, 32, 72, 69

(56) References Cited

U.S. PATENT DOCUMENTS

| 4,246,548 A | 1/1981 | Rutz .......................... 331/94.5 |
|---|---|---|
| 4,488,307 A | 12/1984 | Gamire et al. ................. 372/50 |
| 5,131,002 A | 7/1992 | Mooradian .................... 372/50 |
| 5,237,636 A | 8/1993 | Harada ........................ 385/122 |
| 5,724,376 A | 3/1998 | Kish et al. .................... 372/96 |
| 6,061,381 A | 5/2000 | Adams ......................... 372/96 |
| 6,347,104 B1 | 2/2002 | Dijalli et al. ............. 372/38.01 |

FOREIGN PATENT DOCUMENTS

| JP | 6-314846 | 11/1994 |
|---|---|---|
| JP | 8-78782 | 3/1996 |
| WO | 98/43329 | 10/1998 |

OTHER PUBLICATIONS

Cheng et al. "Angular Filtering of Spatial Modes in a Vertical–Cavity Surface–Emitting Laser by a Fabry–Perot Etalon", Applied Physics Letters, vol. 74, No. 8; Feb. 22, 1999; pp. 1069–1071.
English Language—Patent Abstract of JP 8–078782.
English Language—Patent Abstract of JP 6–314846.
Wilson et al.; "High Single–Mode Output Power From Compact External Microcavity Surface–Emitting Laser Diode", Applied Physics letters, American Institute of Physics, NY, vol. 63, No. 24, Dec. 13, 1993 (pp. 3265–3267).
Sandusky et al: "A CW External–Cavity Surface–Emitting Lasser", IEEE Photonics Technology Letters, NY, vol. 8, No. 3, Mar. 1, 1996 (pp. 313–315).
PCT Search Report.

*Primary Examiner*—Minsun Oh Harvey
*Assistant Examiner*—Armando Rodriguez
(74) *Attorney, Agent, or Firm*—Fulbright & Jaworski L.L.P.

(57) ABSTRACT

An active gain region sandwiched between a 100% reflective bottom Bragg mirror and an intermediate partially reflecting Bragg mirror is formed on a lower surface of a supporting substrate, to thereby provide the first ("active") resonator cavity of a high power coupled cavity surface emitting laser device. The bottom mirror is preferably in direct thermal contact with an external heat sink for maximum heat removal effectiveness. The reflectivity of the intermediate mirror is kept low enough so that laser oscillation within the active gain region will not occur. The substrate is entirely outside the active cavity but is contained within a second ("passive") resonator cavity defined by the intermediate mirror and a partially reflecting output mirror, where it is subjected to only a fraction of the light intensity that is circulating in the gain region. The active gain region is preferably electrically excited, with a circular bottom electrode formed by an oxide current aperture between the bottom mirror and the heat sink, and with an annular top electrode formed on an upper surface of the substrate.

3 Claims, 2 Drawing Sheets

COUPLED CAVITY HIGH POWER SEMICONDUCTOR LASER

This is a Divisional Application of U.S. application Ser. No. 09/519,890, filed Mar. 6, 2000, now U.S. Pat. No. 6,778,582.

FIELD OF THE INVENTION

This invention relates generally to an electro-optical device and, more particularly, to a surface-emitting semiconductor laser.

BACKGROUND OF THE INVENTION

Conventional vertical cavity surface-emitting lasers (VCSELS) typically have two flat resonator cavity mirrors formed onto the two outer sides of a layered quantum-well gain structure, and are significantly limited in single spatial-mode output power, typically a few milliwatts. While greater optical power can be achieved from conventional VCSEL devices by using larger emitting areas, such a large aperture device is not particularly practical for commercial manufacture or use, and produces an output which is typically distributed across many higher order spatial modes. Several schemes have been proposed for increasing single-model output power from surface-emitting devices. One approach is to replace one of the mirrors adjacent the active region of a conventional VCSEL device with a more distant reflector whose curvature and spacing from the active region preferentially supports a fundamental spatial mode. Such a device architecture is called a VECSEL (vertical Extended cavity surface Emitting Laser).

"High single-transverse mode output from external-cavity surface emitting laser diodes", M. A. Hadley, G. C. Wilson, K. Y. Lau and J. S. Smith, Applied Phys. Letters, Vol. 63, No. 12, 20 Sep. 1993, pp. 1607–1609, describes a triple-mirror, coupled-cavity device with an epitaxial p-type bottom Bragg mirror and undoped quantum-well gain structure grown on an external p-type substrate followed by an n-type coupled cavity intermediate mirror. The medium between the coupled cavity intermediate n-type mirror and the output coupler was air. Since any heat produced in the active gain region must be removed through the relatively thick p-type substrate, the practical output power from such a device is limited to about 100 mw for pulsed operation and to only a few mw for continuous ("cw") operation.

"Angular filtering of spatial modes in a vertical-cavity surface-emitting laser by a Fabry-Perot étalon," by Guoqiang Chen, James R. Leger and Anand Gopinath, Applied Physics Letters, Vol. 74 No. 8, Feb. 22, 1999, pp. 1069–1071, describes an integrated Fabry-Perot étalon formed of GaAs between a reduced bottom mirror stack of the VCSEL and a backside dielectric mirror, to thereby form an integrated coupled oscillator in which the angular plane-wave spectra of the higher-order modes have been spatially filtered out. No electrode configurations are shown or described and it is not apparent how that device could be electrically excited to produce high levels of output power.

My commonly assigned PCT publication WO 98/43329 describes a novel architecture for an electrically-excited vertical extended cavity surface emitting laser (VECSEL) device that enables the output power emitted in the single, lowest order $TEM_{00}$ spatial mode to be scaled upwards more than an order of magnitude beyond that achievable with other known VECSELS, while being much more practical and manufacturable than was previously achievable. In that device, the quantum-well gain layers were grown directly on the bottom surface of the n-type substrate; this growth was then followed by the usual highly-reflecting p-type DBR cavity mirror. The laser cavity was formed by depositing an anti-reflective coating on the top surface of the n-type substrate, and placing a concave external mirror away from the substrate with the mirror's optical axis oriented perpendicular to the plane of the substrate, such that the n-type substrate was located physically and optically within the laser cavity. Such an internal substrate configuration not only provides structural integrity and ease of manufacture (especially when the external mirror is formed on or otherwise placed directly on top of the inverted substrate), it also facilitates an electrode placement that is optimal for efficient electrical excitation and operation in the $TEM_{00}$ mode with a larger aperture and high output power levels than would otherwise be possible. However, especially in an electrically pumped device with a relatively thick substrate inside the laser cavity, increasing the doping of the substrate (desirable to minimize carrier crowding and electrical resistance) also increases the optical loss at the laser wavelength and the overall efficiency of the device is correspondingly reduced.

SUMMARY OF THE INVENTION

An overall objective of the present invention is to provide a surface emitting coupled cavity semiconductor laser device capable of producing one or more desired spatial modes at higher power levels and with greater device efficiency than would be feasible with known prior art VCSELs and VECSELs.

In accordance with the broader aspects of the present invention, an undoped gain region sandwiched between a nominally 100% reflective bottom Bragg mirror and an intermediate partially reflecting Bragg mirror is formed on a bottom lower surface of a supporting substrate, to thereby provide the first ("active") resonator cavity of a high power coupled cavity surface emitting VECSEL laser device. The bottom mirror is preferably in direct thermal contact with an external heat sink for maximum heat removal effectiveness. The reflectivity of the intermediate mirror is kept low enough so that laser oscillation within the first active gain region will not will not occur without optical feedback from a second, passive resonator cavity, formed by the intermediate mirror and an external mirror contiguous to the upper surface of the VECSEL substrate. Thus, the substrate is entirely outside the first active resonator cavity but is contained within a second ("passive") resonator cavity defined by the intermediate mirror and a partially reflecting output mirror. This second passive resonator cavity is directly coupled optically to the first active resonator cavity, and is designed to effectively increase the gain within the first active resonator cavity above the laser threshold, and/or to reduce the threshold for laser action in the first active resonator cavity, such that the output of the device is largely determined by the optical feedback from the second passive resonator cavity. Since the substrate is contained only in the second passive resonator cavity, and since the intermediate mirror forming this second passive resonator cavity typically has a transmissivity of only a few percent, the optical laser power in the second cavity is only a small fraction of the laser intensity circulating in the first active resonator cavity; therefore the substrate sees only a correspondingly small percentage of the light intensity energy that is circulating in the gain region. Thus any loss or other undesired effects caused by light intensity energy passing through the substrate are only that same small percentage that they would have been had that same substrate been placed in the same resonant cavity as the active gain region.

In a preferred embodiment, an electrically-excited coupled-cavity VECSEL electrically excited coupled cavity VCSEL utilizes an n-type semiconductor substrate with a partially reflective intermediate reflector (preferably an n-type Bragg mirror) grown on a bottom surface of the substrate. An undoped gain medium is grown or positioned under the intermediate reflector, and a bottom reflector is grown or positioned under the gain medium, to thereby form a first an active resonant cavity containing having an active gain region. The bottom reflector is preferably a p-type Bragg mirror having a reflectivity of almost 100%, which is soldered to or otherwise placed in thermal contact with an external heat sink. A second passive resonator cavity is formed by the partially-transmitting intermediate cavity mirror grown on the bottom surface of the n-type substrate, and a partially-transmitting output cavity mirror, positioned externally above the upper surface of the substrate. The output mirror is positioned above the substrate at the opposite side of the p-type Bragg mirror and defines a passive resonant cavity. This second passive resonator cavity is designed to control the spatial and frequency characteristics of the optical feedback to, and thus the laser oscillation within, the first active resonant cavity. It in effect functions as a spatial filter, with the external output cavity mirror preferably configured (curvature, reflectivity, and distance from the intermediate reflector) to limit the laser to confine the resonant radiation within the second passive resonator cavity to a single fundamental mode; since the mode of any laser output from the first active resonator cavity is determined by the mode of the feedback from the second passive resonator cavity, the output spatial mode from the overall device is essentially confined to that single fundamental mode.

Such a novel VECSEL structure is particularly advantageous when the electrical current is applied to an external electrode and must pass through a conductive substrate in order to reach the active gain region. Since the active gain region is in a first one cavity and the conductive substrate is in second another cavity, the substrate can have a substantially higher doping level and/or a substantially associated lower electrical resistance than would otherwise be possible. The electrode configuration is preferably similar to that described in my referenced International patent publication, with the disk shaped bottom electrode formed by an oxide current aperture between the bottom mirror and the heat sink and with the annular top electrode formed on the top surface of the substrate (above or surrounding the AR coating), to thereby define a cylindrical electrically excited primary gain region surrounded by an annular secondary gain region.

In accordance with the method aspects of the present invention, the first active resonant cavity is epitaxially grown on the bottom surface of the substrate. The top surface of the substrate is provided with an anti-reflective coating and an external output mirror configured to control the desired mode or modes of the laser energy resonating both in the second passive resonant passive and in the first active cavity. In the preferred embodiment the external mirror is separated from the substrate and is configured to provide the desired fundamental mode output. In an alternative embodiment that takes particular advantage of the coupled-cavity configuration to reduce losses within the second passive cavity, the substrate may occupy the full extent of the second passive cavity and its top surface may be configured by binary optics techniques prior to depositing the required upper electrode and top reflector, to thereby produce monolithic fully integrated coupled cavity device.

Optionally a non-linear frequency doubling material may be included inside the second passive resonant cavity to thereby convert or reduce the output wavelength from the longer. Wavelengths associated with typical semiconductor laser materials, such as GaAs and GaInAs, to the shorter wavelengths necessary or desirable for various medical, materials processing, and display applications. In that case, the reflectivity characteristics of the various optical components are preferably chosen to favor the feedback of the unconverted fundamental wavelength back towards the active gain region and the output of any already converted harmonics through the output mirror.

As another option, a polarizing element which selectively favors a desired polarization orientation may be included within the second passive resonant cavity. Such a polarizing element may be in the form of a two-dimensional grid of conductive lines located at an anti-node of the optical energy resonating within the second passive resonant cavity to thereby absorb polarization parallel to those lines, and may be conveniently formed on the upper surface of the substrate adjacent to the anti-reflection layer.

Alternatively a saturable absorber or other suitable mode-locking means may be included within the second passive resonator cavity to provide a high peak power output pulse.

In yet another optional embodiment, the second passive resonator cavity is integrated with one end of a single mode optical fiber by means of a focusing lens element and the reflector defining the upper end of the second passive resonant cavity is in the form of a distributed Bragg reflector formed by longitudinal variations in the refractive index of the fiber.

A plurality of coupled cavity vertical extended cavity surface emitting lasers (VECSELS) devices having different modes and/or frequencies may be fabricated in one- or two-dimensional arrays, to thereby provide a wideband transmission source for multimode optical fiber transmission systems and/or to provide a 3-color light source for a projection display. Alternatively the individual devices of such an array may be operated coherently by means of a shared passive external resonator cavity to provide a coherent single mode output having an even higher power than would otherwise be possible. Such a device would use, for example, a spatial filter in the passive cavity to force all elements of the array to emit in phase.

An additional advantage of a coupled cavity device constructed in accordance with the present invention is that the output laser wavelength is determined by the Fabry-Perot resonance frequency of the active cavity. This wavelength tunes with temperature at the rate of about 0.07 nm per degree centigrade for GaInAs type devices operating in the 980 nm wavelength region, thereby providing a convenient tuning mechanism for certain applications requiring a variable wavelength tunable output, in discrete jumps essentially corresponding to the possible resonances within the second passive cavity.

Although the hereinafter-described preferred embodiment utilizes electrical excitation and an n-type doped substrate, many aspects of the invention are also applicable to optical or e-beam excitation, and to the use of n-type materials for the Bragg mirrors at both ends of the first active resonator cavity, with one or more Esaki diodes placed at resonant nodes inside the first active resonator cavity.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
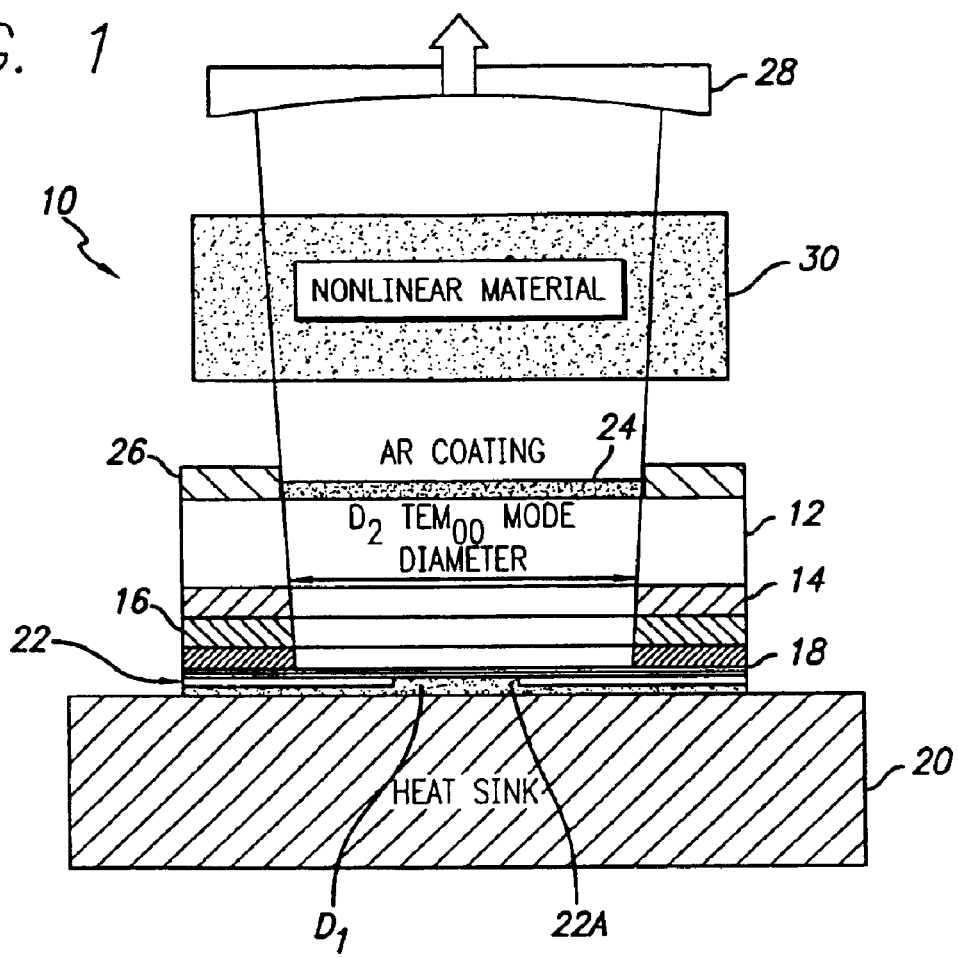
FIG. 1 is a longitudinal cross section of a vertical coupled cavity high power semiconductor laser according to the present invention, with an external output mirror and an optional mode control region between the substrate and the output mirror.
Figure 4:
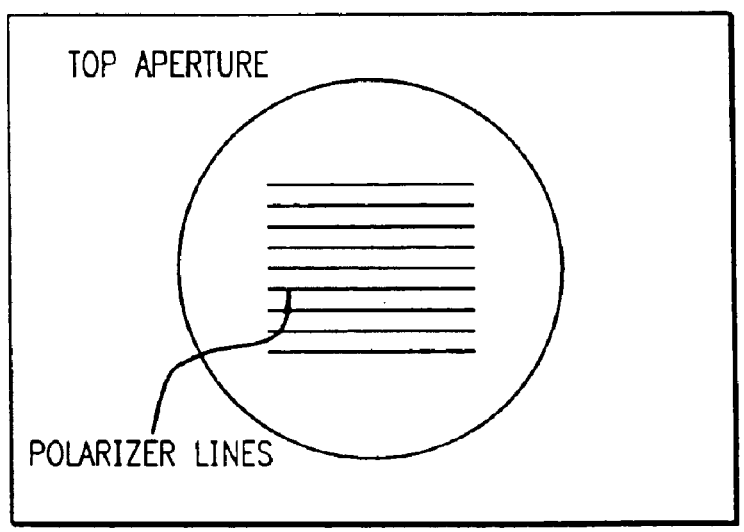
FIG. 4 shows a polarizing element which may be included within the mode control region.

A preferred embodiment of a coupled cavity VECSEL 10 according to the present invention is shown schematically in FIG. 1. The coupled cavity VECSEL 10 includes an n-type semiconductor substrate 12. The substrate 12 of the present invention should be sufficiently thick to be conveniently handled during manufacturing process and is sufficiently doped with n-type dopants to reduce the electrical resistance of substrate 12 to a value required for efficient operation and nearly uniform carrier injection across the current aperture region at high power levels (so that the active gain region is pumping uniformly without excessive carrier crowding), but without a corresponding sacrifice of the optical efficiency, as will be explained in detail in the following paragraphs. In an exemplary embodiment, the current aperture diameter is 100 $\mu$m and the doping level of the n-type dopants in the substrate is approximately between $1\times10^{-17}$ cm$^{-3}$ and $5\times10^{-17}$ cm$^{-3}$; the substrate is approximately 50 $\mu$m to 350 $\mu$m thick.

An intermediate reflector 14 is formed on a first (as illustrated, the bottom) surface of the n-type substrate 12. The intermediate reflector 14 may be epitaxially grown on the substrate 12 or it may be positioned on substrate 12 by various techniques well known in the semiconductor art. In an exemplary embodiment, intermediate mirror 14 is an n-type Bragg reflector built up of 12 to 15 pairs of GaAs/AlAs wells doped with n-type dopants, such as silicon or tellurium, at a concentration of approximately $2\times10^{-18}$ cm$^{-3}$ and can be grown by using the MOCVD or MBE growth that are well know in the art, to thereby produce a reflectivity of about 95%. A typical reflectivity range would be from 80–98%, although it could vary from near zero to more than 99%, depending on the specific application. In general, it should be as high as possible without permitting sufficient gain to occur in the first active resonator cavity to produce stimulated emission without any feedback from the second passive resonator cavity. However, in certain applications in which a non-linear frequency doubler or other mode control element is contained in the second passive resonator cavity, the reflectivity of the intermediate reflector 14 is preferably reduced to a value sufficient to ensure that the power contained in the passive cavity is adequate for efficient frequency conversion.

A gain-region 16 is epitaxially grown or positioned on the lower surface (the side facing away from substrate 12) of the intermediate reflector 14. The gain region 16 is made of multiple-quantum-well III-V compound materials, such as GaInAs, that are well-known in the art. In general, the more quantum wells in the gain region 16 the higher the single pass stimulated gain of the VECSEL will be. However, strain compensation in the gain region 16 containing GaInAs wells may be required for more than three quantum wells to avoid excessive strain that will potentially generate cross-hatch or fracture defects during manufacturing.

A p-type Bragg mirror 18 is epitaxially grown or positioned on the gain region 16 at the opposite side to the substrate 12. Preferably, the p-type Bragg mirror 18 has a reflectivity of approximately 99.9% and is formed by approximately 18 to 30 pairs of quarter wave stacks of GaAs/AlAs layers doped with p-type dopants, such as zinc, carbon or Be, at a concentration of approximately $2-3\times10^{18}$ cm$^{-3}$. The p-type Bragg mirror 18 may be epitaxially grown by using the MOCVD or MBE techniques well known in the art. In an alternative embodiment, the p-type Bragg mirror 18 can also be spatially doped in a narrow region at the interfaces with carbon at a concentration of approximately $1\times10^{19}$ cm$^{-3}$ to reduce the electrical impedance of the p-type Bragg mirror 18 by reducing the effects of localized heterostructure junctions at the quarter wave interfaces within the p-type Bragg mirror 18.

Intermediate reflector 14, gain region 16 and bottom reflector 18 cooperate to define an active cavity having a cavity length l at the wavelength of interest (this wavelength is determined by the Fabry-Perot resonance frequency of the first active resonator cavity and in the absence of a non-linear frequency doubler in the second passive resonator cavity, will be the output wavelength of the device). Since this wavelength tunes with temperature at the rate of about 0.08 nm per degree centigrade for GaInAs type devices operating in the 980 nm wavelength 20 region, a heat sink 20 or other suitable temperature control means is provided which is in thermal contact with the lower surface of the relatively conductive p-type Bragg mirror 18. In the preferred embodiment, the heat sink 20 is formed of beryllia or diamond and includes a conductive electrode 20A. An oxide aperture defining layer 22 is preferably provided between the p-type Bragg mirror 18 and the heat sink 20, which has a generally circular current limiting aperture 22A though which the excitation current I, required to operate the device is confined.

The upper surface of the GaAs wafer 12 is preferably anti-reflection coated with a conventional AR layer 24, but may be left uncoated (nominal 30% reflectivity). Additionally, in yet another embodiment, the first surface of the substrate 12 may be coated with anti-reflection coating to improve efficiency of the VCSEL. For example, the substrate 12 may be coated to be anti-reflection at a fundamental wavelength and be highly reflective at a second harmonic wavelength of the optical emission.

An annular electrode 26 similar to that disclosed in my previously identified International patent publication is formed on the upper surface of substrate 12. The top electrode could cover the entire top surface of the chip with a circular aperture for the laser beam. Its central aperture 26A is preferably substantially larger than the effective diameter of lower electrode 22A, to effectively eliminate any loss due to aperturing of the laser mode. In particular, as described in further detail in that publication (which is hereby incorporated in its entirety by reference), the diameter of the bottom electrode 22A corresponds to the electrically pumped region D1 within the active cavity l and the inner diameter of the upper electrode 26 corresponds to the outer diameter D2 of an optically pumped annular region extending laterally outwards from region D1.

An output mirror 28 is positioned externally and approximately parallel to the substrate 12 in the preferred embodiment, as shown in FIG. 1. The output mirror 28 has a reflectivity in the range of approximately 40%–80%. The external output mirror 28 may be a dielectric mirror.

In an alternative embodiment, a nonlinear material 30 may be positioned inside the passive resonant cavity L defined by the output mirror 28 and the intermediate mirror 14. The nonlinear material 30 may be external to the substrate 12 or it maybe monolithically positioned directly on the substrate 12. The nonlinear material 30 is used in an otherwise conventional manner to convert a substantial portion of the resonant energy to a higher (typically a first harmonic) frequency, with the spectral response of the output mirror being substantially more transmissive for the higher frequency. Suitable nonlinear materials include KTP, KTN, KNbO$_3$, or LiNbO$_3$ and periodically-poled materials such as periodically-poled LiNbO$_3$.

Since the optical emission intensity within the nonlinear material 30 has to be sufficiently high in order to have an efficient nonlinear conversion, by the nonlinear material 30, the reflectivity of the intermediate reflector 14 may be lower and the gain of the active region 16 may be higher (for example, by the use of more quantum wells) than what would otherwise be optimal for output at the fundamental frequency of the active cavity 1. Alternatively, the optical emission intensity of both resonant cavities 1, L and thus the frequency conversion efficiency of the device could be increased by means of an RF driven injection current that would produce a mode-locked operation of the device operating at a repetition frequency equal to the cavity round trip frequency or harmonics of it. This would produce short optical pulses with peak power levels as much as 100 times that of a cw device.

To further increase the efficiency of the nonlinear conversion, the transmissivity of the intermediate reflector 14 and or/of the AR coating 24 is preferably made substantially higher for the fundamental frequency than for the higher frequency harmonics, thereby selectively feeding back only the fundamental frequency into the active cavity 1.

Figure 2:
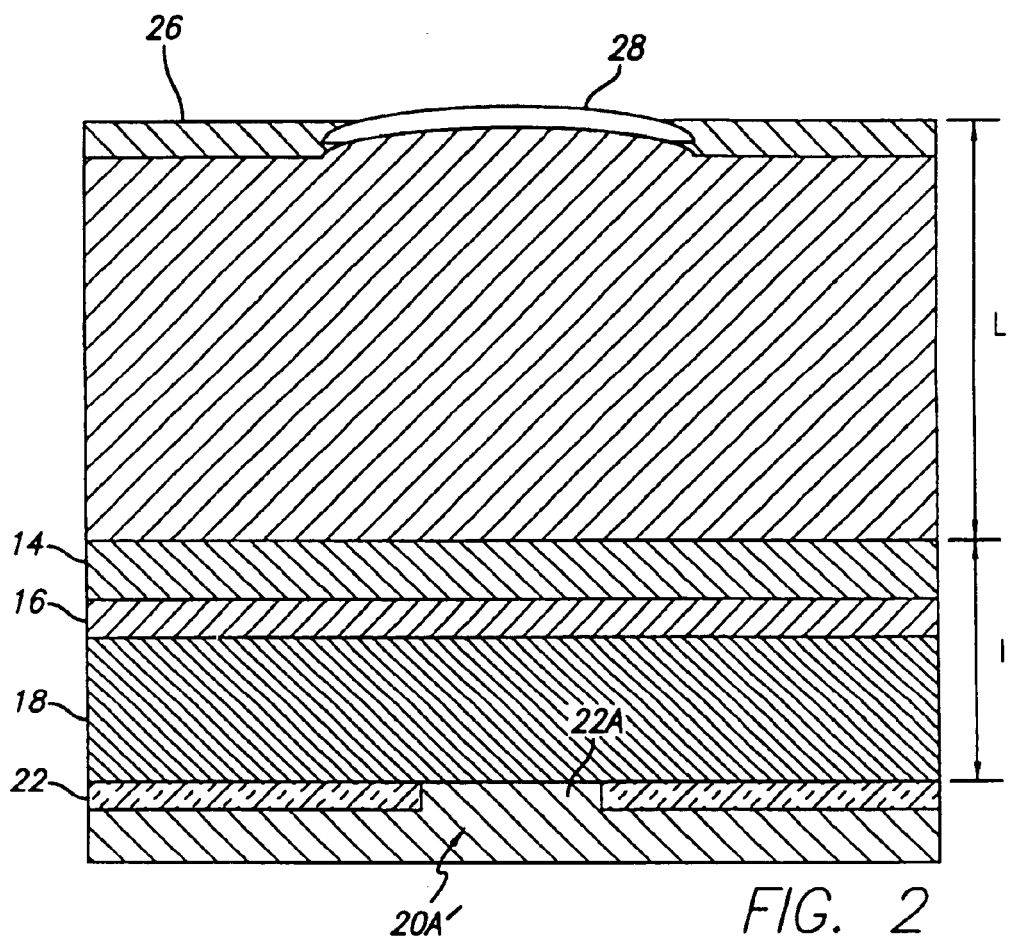
FIG. 2 is a longitudinal cross section of an alternative embodiment of the present invention, with a integrated output mirror formed directly on the upper surface of the substrate.

In another alternative embodiment, the output mirror 28 may be formed directly on the substrate 26, as shown in FIG. 2. In the alternative embodiment, the output mirror 28 may be formed by a dielectric mirror or by an n-type Bragg mirror having a reflectivity in the above-mentioned range. For the n-type Bragg output mirror in the alternative embodiment, the output mirror 28 is monolithically grown on a first surface of the substrate 12. Prior to the growth of the output mirror 28, the first surface of the substrate 12 is etched by otherwise conventional binary optics etching techniques to form an appropriately shaped surface. Alternatively, a dielectric mirror can be deposited on the etched surface that would form a concave mirror output coupler.

The optical emission that passes the intermediate reflector 14 and into the substrate 12 would effectively see significantly less optical loss than it would have been without the intermediate reflector 14. The doping density and the thickness of the substrate 12 normally dominate the optical loss of the VCSEL due to the free carrier absorption effect in the substrate 12. As noted, there is a design trade-off between the thickness, electrical resistance, and optical loss of the substrates of conventional VCSELs for optimum device performance. Generally, the higher the doping. Level of the substrate or the thicker the substrate, the bigger the optical loss of the VCSELS will be. Consequently, substrates of conventional VCSELS tend to have high doping levels to reduce the impedance and to have thin substrates to reduce the optical loss. In contrast, the present invention limits the amount of optical emission, approximately 5% of the optical emission, entering the substrate 12 before it reaches the lasing threshold, thereby reducing the overall optical loss of the VCSEL 10. As a result, by having an intermediate reflector 14, the present invention can further increase the doping level of the substrate 12 for a low impedance and/or utilize a thicker substrate 12 for better handling during manufacturing of the VECSEL 10, while at the same time greatly increasing the overall efficiency of the VCSEL 10. In general, the thickness of the substrate 12 according to the present invention ranges from about 50 $\mu$m to 350 $\mu$m that would allow the VCSELS to be handled rather easily for mass production. Moreover, the high doping concentration in the substrate 12 produces additional benefits of a near uniform injected carrier distribution across the aperture region surrounded by the oxide aperture 22, even at very high current densities.

In the present invention, much of the optical energy emission originating in the gain region 16 will be confined inside the gain region 16 due to high the reflectivities (for example 95% and 99.9% respectively) of the intermediate reflector 14 and the p-type Bragg mirror 18 and will resonate therein until the optical emission reaches the threshold lasing level. Since the substrate is contained only in the second passive resonator cavity and the exemplary intermediate mirror has a transmissivity of only a few percent, the energy level in the second passive resonator cavity is only a few percent of the energy level in the first cavity and the substrate sees significantly less of the light energy that is circulating in the gain region. Thus any loss or other undesired effects caused by light energy passing through the substrate are only a few percent of what they would have been had that same substrate been in the same resonant cavity as the active gain region, and the overall efficiency of the device have been increased by as much as 10 to 20 fold.

Thus, the coupled cavity design according to the present invention is capable of generating a very high emission power. For example, more than one watt has been produced in a $TEM_{00}$ mode at wavelengths of about 960–980 nm, with injection current diameters ranging from 75 to 250 $\mu$m, and intermediate reflector reflectivity of about 90% to 95% and output mirror reflectivity of about 20% to 90%. However, optimum output power is generally achieved by using an output mirror 28 having a reflectivity ranging between 40% and 60% and with the Fabry-Perot wavelength of the active cavity kept close to that of the desired emission peak, for example by careful control of active cavity length 1 during the growth process. In this case, the surface of the substrate was anti-reflection coated.

Figure 3:
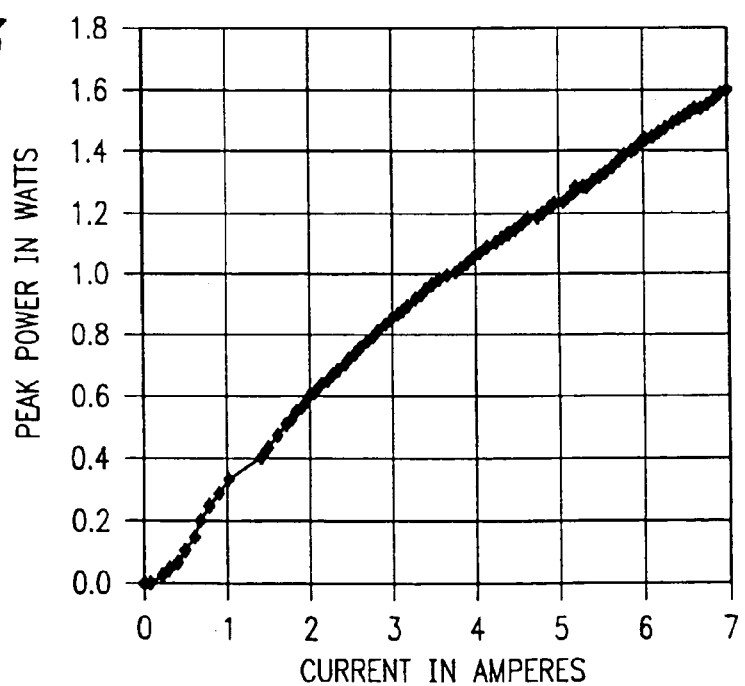
FIG. 3 is an output power curve showing pulsed output power for a preferred embodiment as a function of current.

FIG. 3 shows a polarizing element 32 which selectively favors a desired polarization orientation. AS illustrated it is in the form of a two-dimensional grid of conductive lines and is located at an anti-node of the optical energy resonating within the second passive resonant cavity to thereby preferentially absorb polarization parallel to those lines. In an exemplary embodiment, it may be conveniently formed on the upper surface of the substrate 12 adjacent to the anti-reflection layer 24. Since polarizing element 32 is inside 25 the second (passive) cavity, higher losses in the favored polarization direction can be tolerated than would be the case for a single cavity device.

Referring specifically to FIG. 3, a 100-micron current aperture coupled cavity device operating in pulsed power mode has been observed to produce a circular $TEM_{00}$ mode at 963 nm with an output power as a function of current is that is essentially kink-free up to the full power level. The slight change just above one ampere corresponds to a scale change in the power supply. The change in slope efficiency is likely due to transient heating that shifts the gain peak away from coupled cavity Fabry-Perot wavelength, since the device under test was not soldered to a heat sink and likely experienced an increase in temperature during the injection current pulse. Additionally the design of the test device did not take into account the presence of any lateral stimulated optical emission in the plane of the device structure that would direct energy out of the mode region, and would be even more efficient (and the power curve would be more linear) at higher power levels if designed to incorporate the teachings of my referenced International patent publication. since the dominant wavelength inside the active resonant cavity 16 tunes with temperature at the rate of about 0.07 nm per degree centigrade for GaInAs type devices operating in the 980 nm wavelength region, changes in temperature (for example, by selective adjustment of current density) provide a convenient tuning mechanism for certain applications requiring a wavelength corresponding to one or more of the possible resonances within the passive resonant cavity. Alternatively, it may be desirable to apply a small dither to the excitation current I to force partition (sharing of power) over several longitudinal modes. For example, by providing a relatively long passive cavity L, the supported modes will be more than 20 GHz apart and the effects of stimulated Brillouin scattering in single-mode optical fibers can be substantially reduced by varying the power and therefor the temperature of the active gain region. In that case, the frequency of dither should be substantially faster than the time it takes for backward SBS wave to build up, with higher dither frequencies being required for higher levels of laser power in the fiber.

Even higher levels of output power may be achieved by means of an array of VECSELS constructed in accordance with the preset invention. Power levels of more than 10 watts can be achieved from such array approaches.

A plurality of the above-described VECSEL elements 10 fabricated on a single semiconductor substrate 12 may be made to oscillate together incoherently by driving them in parallel from a common source of electrical or optical energy, to thereby provide a higher output power than would be possible from a single VECSEL device. Alternatively, the individual VECSELS may be driven optically in serail fashion, with some or all of the output from one element driving the next. In either case, each of the individual coupled cavity laser elements can have a structure and a mode of operation substantially identical to that described previously. The output beams from the individual elements will all travel effectively in the same direction and can be focused by a single lens to one point.

It is also possible to fabricate an array of the above-described coupled cavity VECSELS such that the all elements of the array operate coherently with respect to one-another. This can be achieved in either of two ways. In the first, similar to what has been described in my U.S. Pat. No. 5,131,002 for a set of non-coupled cavity emitting elements (which is hereby incorporated by reference) all of the optical elements are connected in series to add the optical laser power from each element, but the elements are separated to spear the thermal load. Alternatively, all elements of the array may be made to oscillate coherently with respect to one another by a single common external cavity with the light output from all the elements focused at an output coupler, by means of a spatial filter that rejects light in those regions which would have no light present if all elements of the array were oscillating coherently together as a result of destructive interference. Such a "spatial filter" based on destructive interference is described by Rutz in U.S. Pat. No. 4,246,548 (which is also incorporated by reference). However, when applying Rutz' spatial filter to an array of coupled cavity VECSELS, it is important that the frequencies of all of the emitting elements lie close to each other. Each frequency is defined by the length of the short active cavity, while the bandwidth of the allowed frequencies is related to the magnitude of the mirror reflectivity values. This requires that the temperature variation across the array must be controlled to better than a degree. It is also important that the growth tolerance of the wafer is to be such that a corresponding level of accuracy is maintained, which is not particularly difficult with present epitaxial growth technology.

From the foregoing, it will be appreciated that, although specific embodiments of the invention have been described herein for purposes of illustration, various modifications may be made by persons skilled in the art without deviating from the spirit and/or scope of the invention. Specifically, the VECSEL according to the present invention is capable of producing high power output. However, the present invention may be readily adapted to various low power applications by appropriate adjustments of both the effective diameter of the gain region and the injection current level, so as to provide an optimal current density in the active gain region for laser operation. The dimensions and doping levels of various regions of the devices may also be modified to accomplished optimum performance for various applications. The reflectivities of the intermediate reflector 14, the p-type Bragg mirror 18, and the output mirror 28 may also be adjusted to accomplish optimum performance results.

What is claimed is:

1. A method of manufacturing a surface emitting coupled cavity semiconductor laser device, comprising the following steps:

preparing a semiconductor substrate, the semiconductor substrate being doped with n-type dopants;

epitaxially growing an n-type Bragg mirror on the semiconductor substrate;

epitaxially growing an undoped gain medium on the n-type Bragg mirror;

epitaxially growing a p-type Bragg mirror on the gain medium, the n-type and the p-type Bragg mirrors defining a gain cavity; and positioning an output mirror at the substrate side opposite to the P Bragg mirror, the output mirror and the p-type Bragg mirror defining a resonant cavity of the semiconductor laser device.

2. The method of claim 1, further comprising the following steps:

coating a substrate surface facing the output mirror with anti-reflective materials;

positioning an oxide aperture on the p-type Bragg mirror opposite to the gain medium; and positioning a heat sink on the oxide aperture.

3. The method of claim 1, prior to the step of positioning the output mirror, further comprising the following steps:

etching the substrate surface to a predetermined curved shape;

coating the curved substrate surface with anti-reflective materials; and monolithically positioning the output mirror directly adjacent to the curved substrate surface.

* * * * *